(12) United States Patent
Feilchenfeld et al.

(10) Patent No.: US 7,904,868 B2
(45) Date of Patent: Mar. 8, 2011

(54) STRUCTURES INCLUDING MEANS FOR LATERAL CURRENT CARRYING CAPABILITY IMPROVEMENT IN SEMICONDUCTOR DEVICES

(75) Inventors: Natalie Barbara Feilchenfeld, Jericho, VT (US); Zhong-Xiang He, Essex Junction, VT (US); Qizhi Liu, Essex Junction, VT (US); BethAnn Rainey, Williston, VT (US); Ping-Chuan Wang, Hopewell Junction, NY (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 687 days.

(21) Appl. No.: 11/873,711

(22) Filed: Oct. 17, 2007

(65) Prior Publication Data

US 2009/0106726 A1    Apr. 23, 2009

(51) Int. Cl.
*G06F 17/50* (2006.01)
(52) U.S. Cl. ............ 716/132; 716/54; 716/101; 716/119
(58) Field of Classification Search .................... 716/54, 716/101, 119, 132
See application file for complete search history.

(56) References Cited

U.S. PATENT DOCUMENTS

| | | | |
|---|---|---|---|
| 6,074,899 A | 6/2000 | Voldman | |
| 6,110,824 A | 8/2000 | Licata et al. | |
| 6,127,264 A | 10/2000 | Bandyopadhyay et al. | |
| 6,225,207 B1 | 5/2001 | Parikh | |
| 6,498,385 B1 | 12/2002 | Daubenspeck et al. | |
| 6,764,919 B2 | 7/2004 | Yu et al. | |
| 6,794,304 B1* | 9/2004 | Gu et al. ........................ | 438/740 |
| 7,080,340 B2* | 7/2006 | Goren et al. ..................... | 716/12 |
| 7,087,516 B2* | 8/2006 | Hau-Riege ..................... | 438/622 |
| 7,453,151 B2* | 11/2008 | Feilchenfeld et al. ........ | 257/774 |
| 2004/0222529 A1 | 11/2004 | Dostalik et al. | |
| 2005/0098896 A1 | 5/2005 | Huang et al. | |

FOREIGN PATENT DOCUMENTS

JP          55141739 A      11/1980

OTHER PUBLICATIONS

Office Action (Mail Date May 10, 2010) for U.S. Appl. No. 12/198,196, filed Aug. 26, 2008; Confirmation No. 3652.
Notice of Allowance (Mail Date Jul. 11, 2008) for U.S. Appl. No. 11/460,314, filed Jul. 27, 2006; Confirmation No. 1812.

* cited by examiner

*Primary Examiner* — Thuan Do
(74) *Attorney, Agent, or Firm* — Schmeiser, Olsen & Watts; Richard M. Kotulak

(57) ABSTRACT

A design structure including a semiconductor structure. The semiconductor structure includes (a) a substrate; (b) a first semiconductor device on the substrate; (c) N ILD (Inter-Level Dielectric) layers on the first semiconductor device, wherein N is an integer greater than one; and (d) an electrically conductive line electrically coupled to the first semiconductor device. The electrically conductive line is adapted to carry a lateral electric current in a lateral direction parallel to an interfacing surface between two consecutive ILD layers of the N ILD layers. The electrically conductive line is present in at least two ILD layers of the N ILD layers. The electrically conductive line does not comprise an electrically conductive via that is adapted to carry a vertical electric current in a vertical direction perpendicular to the interfacing surface.

7 Claims, 12 Drawing Sheets

STRUCTURES INCLUDING MEANS FOR LATERAL CURRENT CARRYING CAPABILITY IMPROVEMENT IN SEMICONDUCTOR DEVICES

CROSS-REFERENCE TO RELATED APPLICATIONS

The present U.S. utility patent application is related to U.S. patent application Ser. No. 11/460,314, filed Jul. 27, 2006.

FIELD OF THE INVENTION

The present invention relates to design structures including circuits for improvements of current carrying capability in semiconductor devices, and more specifically, to design structures including circuits for improvements in lateral current carrying capability in semiconductor devices.

BACKGROUND OF THE INVENTION

In a conventional integrated circuit (chip), lateral current carrying lines for carrying lateral currents throughout the chip are usually made of copper which is vulnerable to electromigration. Therefore, there is a need for a structure (and a method for forming the same), in which the lateral current carrying lines are less vulnerable to electromigration than those of the prior art.

SUMMARY OF THE INVENTION

The present invention provides design structures including a semiconductor structure, comprising (a) a substrate; (b) a first semiconductor device on the substrate; (c) N ILD (Inter-Level Dielectric) layers on the first semiconductor device, wherein N is an integer greater than one; and (d) a first electrically conductive line electrically coupled to the first semiconductor device, wherein the first electrically conductive line is adapted to carry a lateral electric current in a lateral direction parallel to an interfacing surface between two consecutive ILD layers of the N ILD layers, wherein the first electrically conductive line is present in at least two ILD layers of the N ILD layers, and wherein the first electrically conductive line does not comprise an electrically conductive via that is adapted to carry a vertical electric current in a vertical direction perpendicular to the interfacing surface.

The present invention also provides design structures including a semiconductor structure, comprising (a) a substrate; (b) a semiconductor device on the substrate; (c) N ILD (Inter-Level Dielectric) layers on the semiconductor device, wherein N is an integer greater than one; and (d) an electrically conductive line in a top ILD layer of the N ILD layers, wherein the electrically conductive line is electrically coupled to the semiconductor device through a plurality of P vias and Q lines, wherein P and Q are positive integers and P+Q is greater than 2, wherein the plurality of P vias and Q lines overlap one another such that there exists an imaginary straight line that intersects all the plurality of P vias and Q lines, and wherein the plurality of P vias and Q lines reside in the N ILD layers.

The present invention also provides design structures including a semiconductor structure, comprising (a) a substrate; (b) a semiconductor device on the substrate; (c) N dielectric layers on the semiconductor device, wherein N is an integer greater than one; and (d) an electrically conductive line in a dielectric layer of the N dielectric layers, wherein the electrically conductive line is adapted to carry a lateral electric current in a lateral direction parallel to an interfacing surface between two consecutive dielectric layers of the N dielectric layers, wherein the electrically conductive line is electrically coupled to the semiconductor device, and wherein the electrically conductive line comprises a material which is more resistant to electromigration than copper.

The present invention also provides a design structure including a circuit for a semiconductor structure fabrication method, comprising providing a semiconductor structure which includes (a) a substrate; (b) a semiconductor device on the substrate; and (c) N ILD (Inter-Level Dielectric) layers on the semiconductor device, wherein N is an integer greater than one; forming a first electrically conductive line electrically coupled to the semiconductor device, wherein the first electrically conductive line is adapted to carry a lateral electric current in a lateral direction parallel to an interfacing surface between two consecutive ILD layers of the N ILD layers, wherein the first electrically conductive line is present in all N ILD layers, and wherein the first electrically conductive line does not comprise an electrically conductive via that is adapted to carry a vertical electric current in a vertical direction perpendicular to the interfacing surface.

The present invention provides design structures including a structure in which the lateral current carrying lines are less vulnerable to electromigration than those of the prior art.

DETAILED DESCRIPTION OF THE INVENTION

Figure 1A:
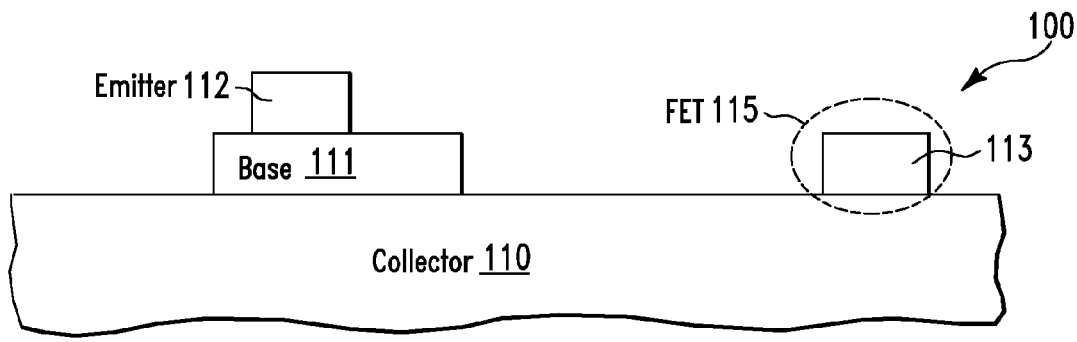
FIGS. 1A-1I illustrate a design structure including a circuit for a fabrication method for forming a semiconductor structure, in accordance with embodiments of the present invention.

FIGS. 1A-1I illustrate a design structure including a circuit for a fabrication method for forming a semiconductor structure 100, in accordance with embodiments of the present invention. More specifically, with reference to FIG. 1A, in one embodiment, the fabrication of the semiconductor structure 100 starts out with a semiconductor substrate 1s10 which will be used as a semiconductor collector region 110 for a subsequently formed bipolar transistor. Illustratively, the semiconductor substrate 110 comprises a semiconductor material such as silicon (Si), germanium (Ge), silicon germanium (SiGe), silicon carbide (SiC), and those materials consisting essentially of one or more compound semiconductors such as gallium arsenic (GaAs), gallium nitride (GaN), and indium phosphoride (InP), etc.

Next, in one embodiment, a semiconductor base region 111 is formed on top of the semiconductor substrate 110, and then, a semiconductor emitter region 112 is formed on top of the semiconductor base region 111 by using any conventional methods. The semiconductor collector region 110, the semiconductor base region 111, and the semiconductor emitter region 112 can be collectively referred to as a bipolar transistor 110+111+112. It should be noted that if the semiconductor collector region 110 and the semiconductor emitter region 112 comprise N-type dopants (e.g., phosphorous or arsenic) and the semiconductor base region 111 comprises P-type dopants (e.g., boron), the bipolar transistor 110+111+112 is a NPN transistor. It also should be noted that if the semiconductor collector region 110 and the semiconductor emitter region 112 comprise P-type dopants and the semiconductor base region 111 comprises N-type dopants, the bipolar transistor 110+111+112 is a PNP transistor.

Next, in one embodiment, an FET (Field Effect Transistor) 115 is formed on the semiconductor substrate 110 by using any conventional methods. For simplicity, only a gate electrode region 113 of the FET 115 is shown in FIG. 1A.

Figure 1B:
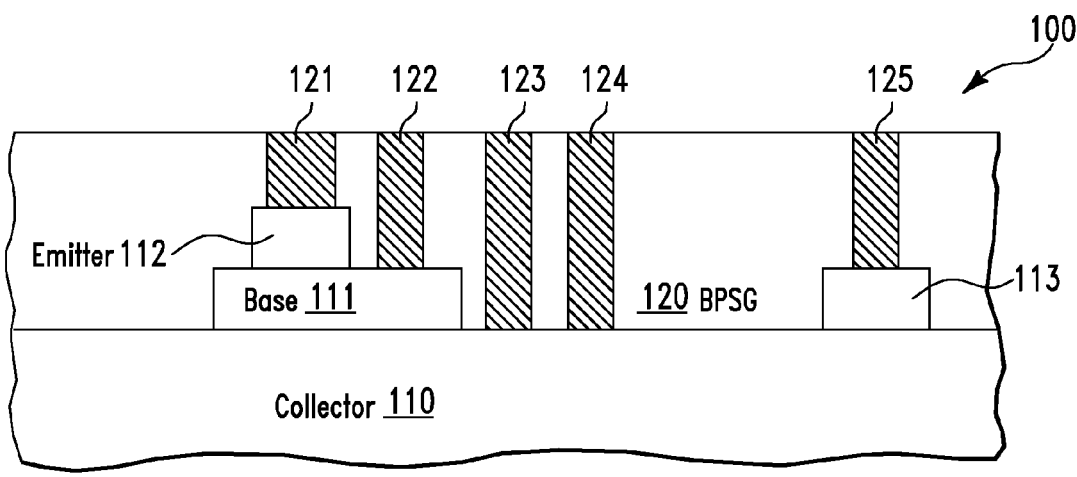

Next, with reference to FIG. 1B, in one embodiment, a BPSG (Boro-Phospho-Silicate Glass) layer 120 is formed on top of the entire structure 100 of FIG. 1A. In one embodiment, the BPSG layer 120 can be formed by CVD (Chemical Vapor Deposition) of BPSG material on top of the entire structure 100 of FIG. 1A, followed by a CMP (Chemical Mechanical Polishing) step. Then, in one embodiment, contact regions 121, 122, 123, 124, and 125 are formed in the BPSG layer 120 by using any conventional methods. Illustratively, the contact region 121 is electrically coupled to the semiconductor emitter region 112; the contact region 122 is electrically coupled to the semiconductor base region 111; the contact regions 123 and 124 are electrically coupled to the semiconductor collector region 110; and the contact region 125 is electrically coupled to the gate electrode region 113. In one embodiment, the contact regions 121, 122, 123, 124, and 125 comprise tungsten.

Figure 1C:
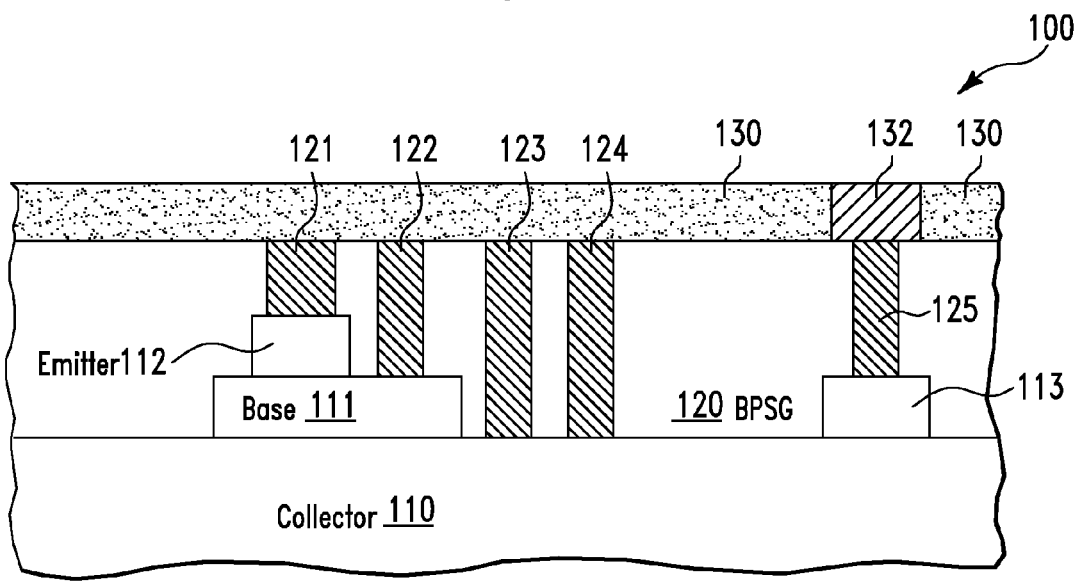

Next, with reference to FIG. 1C, in one embodiment, an ILD (Inter-Level Dielectric) layer 130 is formed on top of the structure 100 of FIG. 1B, illustratively, by CVD of a dielectric material. Then, in one embodiment, a metal line 132 (also called an electrically conductive line 132) is formed in the ILD layer 130 by using a conventional single damascene method. Illustratively, the metal line 132 is electrically coupled to the contact region 125. In one embodiment, the metal line 132 comprises copper. In one embodiment, there is a thin metal (e.g., tantalum nitride) liner layer on side walls and a bottom wall of the metal line 132, but this layer is not shown for simplicity.

Figure 1D:
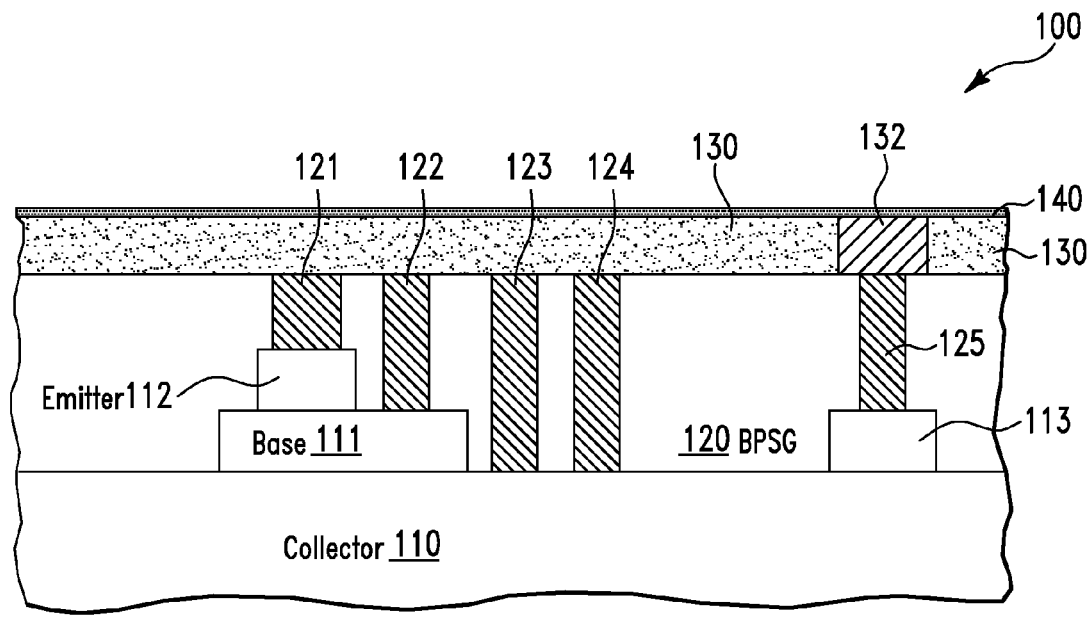

Next, with reference to FIG. 1D, in one embodiment, a copper diffusion barrier layer (hereafter referred to as barrier layer) 140 is formed on top of the ILD layer 130. In one embodiment, the barrier layer 140 can be formed by CVD deposition on top of the ILD layer 130. The barrier layer may comprise silicon nitride or silicon carbide.

Figure 1E:
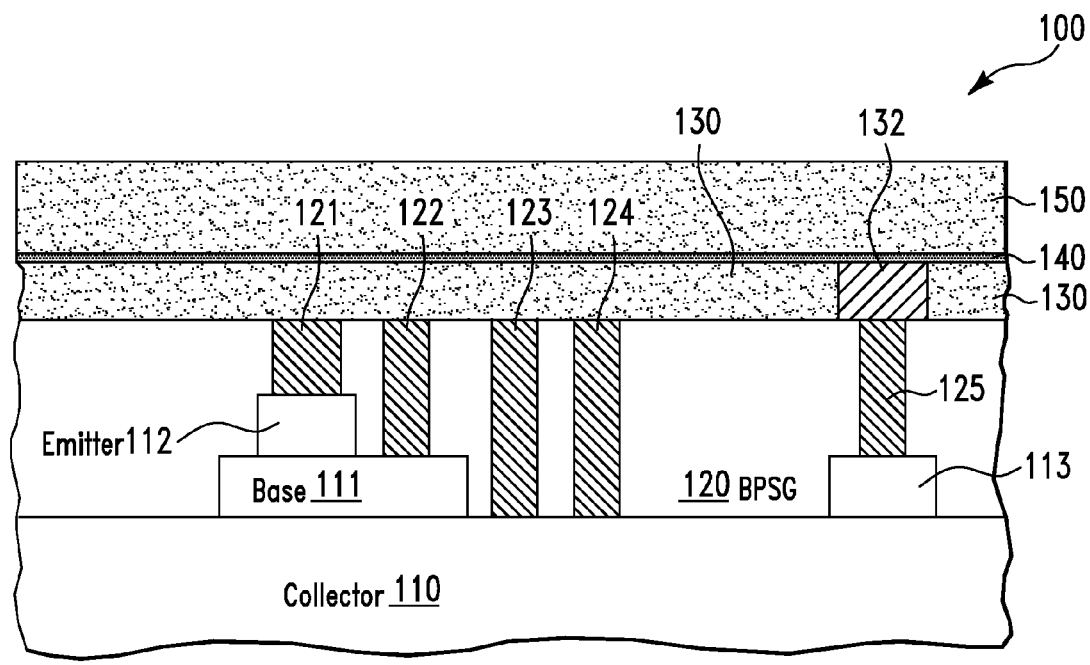

Next, with reference to FIG. 1E, in one embodiment, an ILD layer 150 is formed on top of the barrier layer 140 by using a conventional method. It should be noted that the ILD layer 150 actually comprises two or multiple ILD sub-layers (not shown).

Figure 1F:
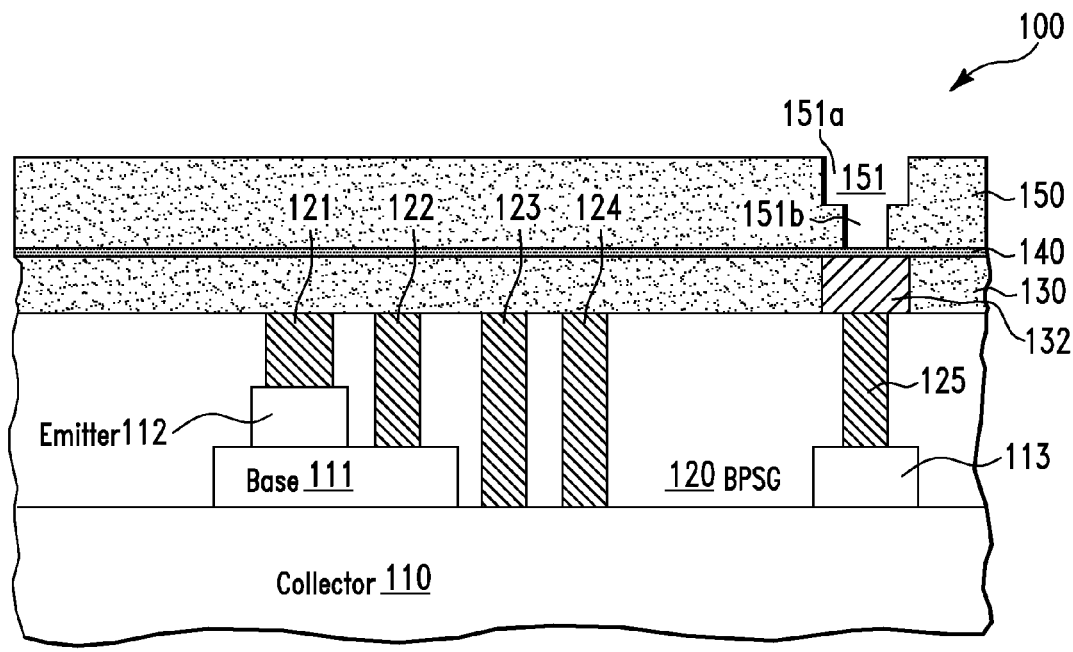

Next, with reference to FIG. 1F, in one embodiment, a trench-via combination 151 (comprising a trench 151a and a via 151b) is formed in the ILD layer 150 by using a conventional dual damascene technique. In one embodiment, the etching process to form the trench-via combination 151 essentially stops at the barrier layer 140.

Figure 1G:
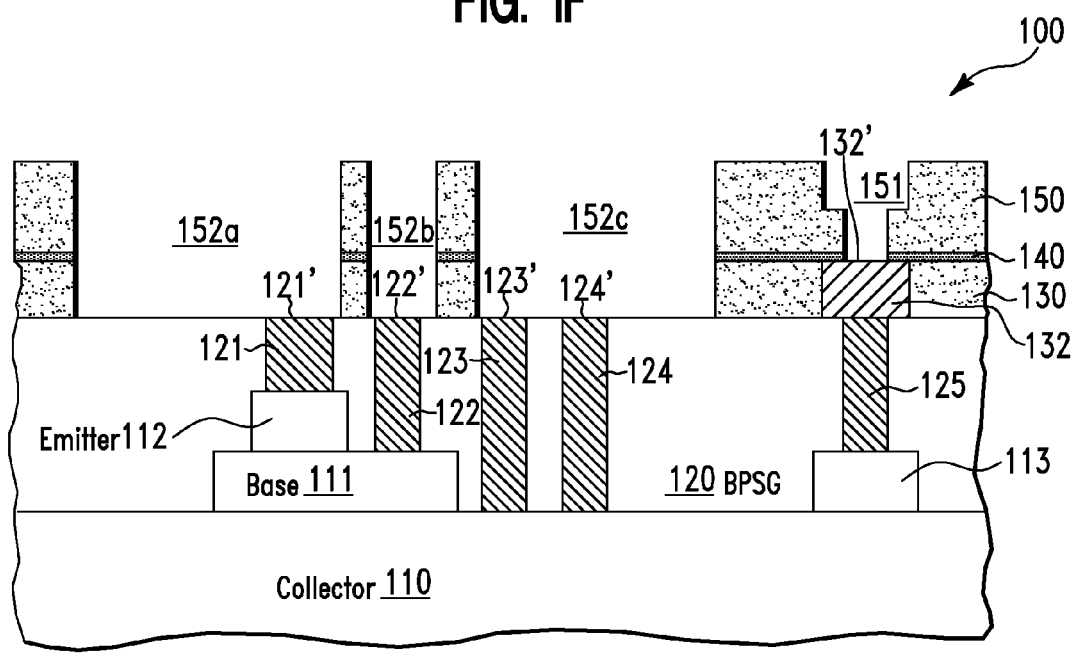

Next, with reference to FIG. 1G, in one embodiment, trenches 152a, 152b, and 152c are formed in the ILD layer 150, the barrier layer 140, and the ILD layer 130 by using a conventional triple damascene technique. In one embodiment, the etching process to form the trenches 152a, 152b, and 152c essentially stops at the BPSG layer 120 and exposes top surfaces 121', 122', 123', and 124' of the contact regions 121, 122, 123, and 124, respectively, to the surrounding ambient. In one embodiment, the etching process to form the trenches 152a, 152b, and 152c also removes a portion of the barrier layer 140 to expose top surface 132' of the metal line 132 to the surrounding ambient.

Figure 1H:
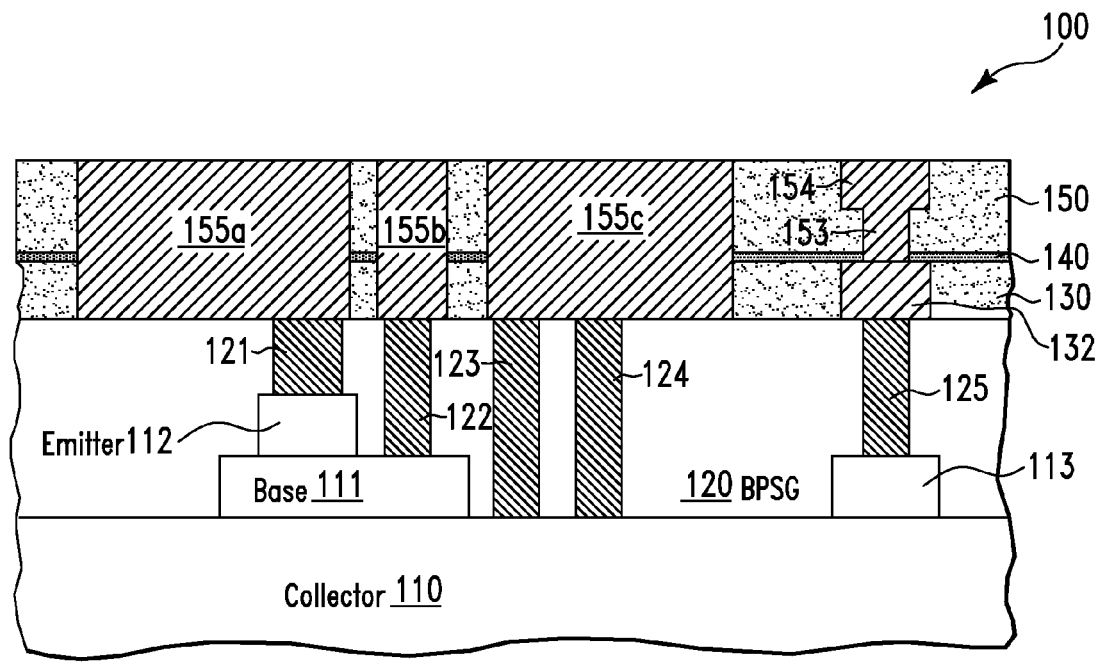

Next, in one embodiment, the trench-via combination 151, the trenches 152a, 152b, and 152c are filled with an electrically conductive material so as to form line-via combination 153+154 (including a metal via 153 and a metal line 154), lateral current carrying lines 155a, 155b, and 155c, respectively, resulting in the structure 100 of FIG. 1H. Illustratively, the line-via combination 153+154, the lateral current carrying lines 155a, 155b, and 155c are formed by depositing the electrically conductive material on top of the entire structure 100 of FIG. 1G (including in the trench-via combination 151, the trenches 152a, 152b, and 152c) and then polishing by a CMP step to remove excessive material outside the trench-via combination 151, the trenches 152a, 152b, and 152c. In one embodiment, the line-via combination 153+154, the lateral current carrying lines 155a, 155b, and 155c comprise copper. In one embodiment, there are thin metal (e.g., tantalum nitride) liner layers on side walls and bottom walls of the line-via combination 153+154, the lateral current carrying lines 155a, 155b, and 155c, but these layers are not shown for simplicity. It should be noted that, in FIG. 1H, the lateral current carrying lines 155a, 155b, and 155c are present in the ILD layers 130 and 150 (wherein the ILD layer 150 comprises two ILD sub-layers).

Figure 1I:
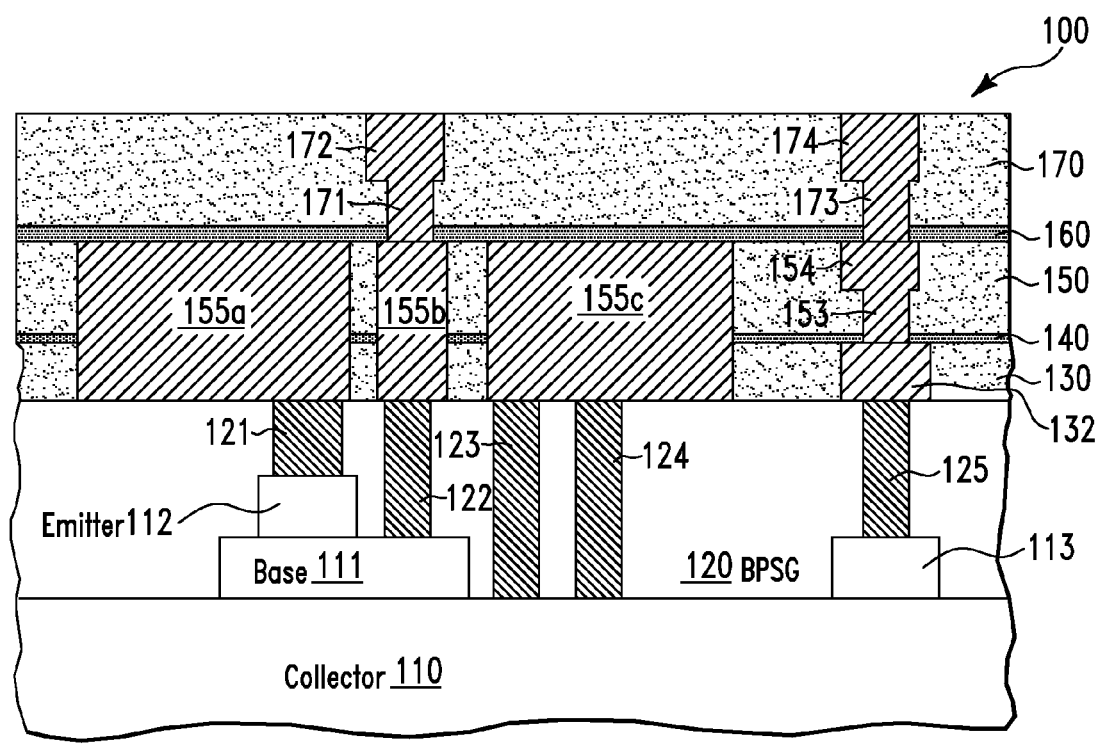

Next, with reference to FIG. 1I, in one embodiment, a barrier layer 160 is formed on top of the structure 100 of FIG. 1H. Then, in one embodiment, an ILD layer 170 is formed on top of the barrier layer 160, illustratively, by CVD of a dielectric material. Next, line-via combinations 171+172 (including a metal via 171 and a metal line 172) and 173+174 (including a metal via 173 and a metal line 174) are formed in the barrier layer 160 and the ILD layer 170 by using a conventional dual damascene method. Illustratively, the line-via combination 171+172 is electrically coupled to the lateral current carrying line 155b; and the line-via combination 173+174 is electrically coupled to the metal line 153+154. In one embodiment, the line-via combinations 171+172 and 173+174 comprise copper. In one embodiment, there are thin metal (e.g., tantalum nitride) liner layers on side walls and bottom walls of the line-via combinations 171+172 and 173+174, but these layers are not shown for simplicity.

As can be seen in FIG. 1I, the lateral current carrying lines 155a and 155c have large cross-section areas. As a result, these two lateral current carrying lines 155a and 155c can conduct high lateral currents to and from the semiconductor emitter region 112 and the semiconductor collector region 110 of the bipolar transistor 110+111+112 without suffering from electromigration effect. This is particularly useful in the application in which the bipolar transistor 110+111+112 is used as a power transistor in a semiconductor chip.

Figure 2A:
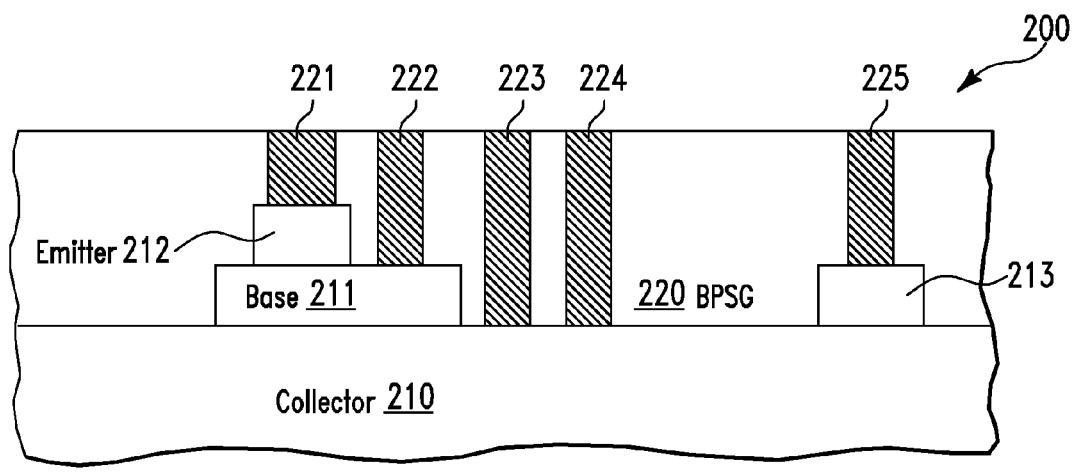
FIGS. 2A-2D illustrate a design structure including a circuit for a second fabrication method for forming a second semiconductor structure, in accordance with embodiments of the present invention.

FIGS. 2A-2D illustrate a design structure including a circuit for a second fabrication method for forming a second semiconductor structure 200, in accordance with embodiments of the present invention. More specifically, in one embodiment, the second fabrication method starts out with the structure 200 of FIG. 2A. In one embodiment, the structure 200 of FIG. 2A is similar to the structure 100 of FIG. 1B. Illustratively, the formation of the structure 200 of FIG. 2A is similar to the formation of the structure 100 of FIG. 1B. It should be noted that similar regions of the structure 200 of FIG. 2A and the structure 100 of FIG. 1B have the same reference numerals, except for the first digit. For instance, a BPSG layer 220 (FIG. 2A) and the BPSG layer 120 (FIG. 1B) are similar.

Figure 2B:
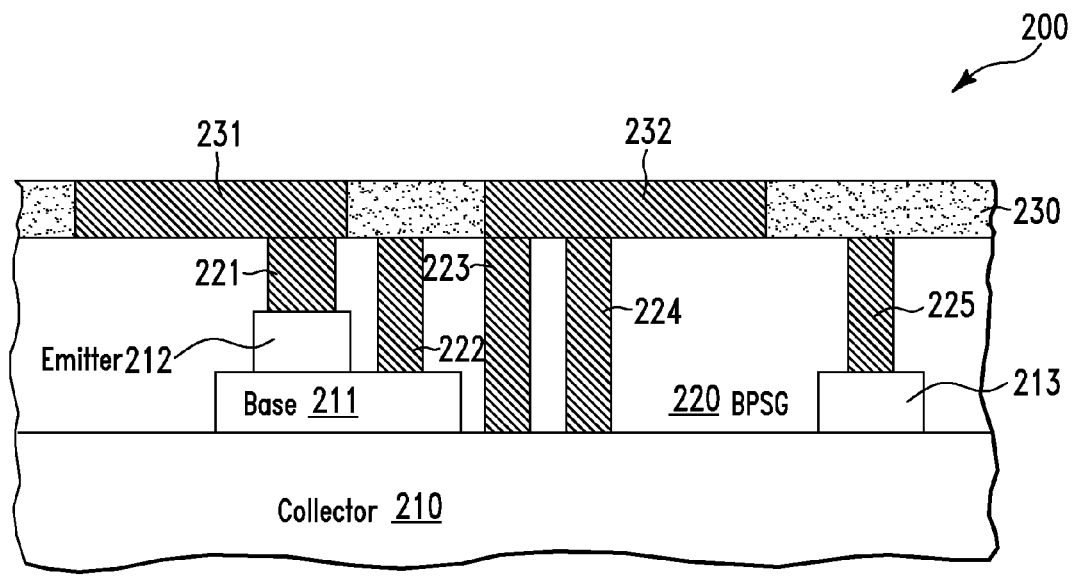

Next, with reference to FIG. 2B, in one embodiment, an ILD (Inter-Level Dielectric) layer 230 is formed on top of the structure 200 of FIG. 2A, illustratively, by CVD of a dielectric material. Then, in one embodiment, lateral current carrying lines 231 and 232 are formed in the ILD layer 230 by using a conventional single damascene method. Illustratively, the lateral current carrying line 231 is electrically coupled to the contact region 221; and the lateral current carrying line 232 is electrically coupled to the contact regions 223 and 224. In one embodiment, the lateral current carrying lines 231 and 232 comprise tungsten. It should be noted that tungsten is more resistant to electromigration than copper.

Figure 2C:
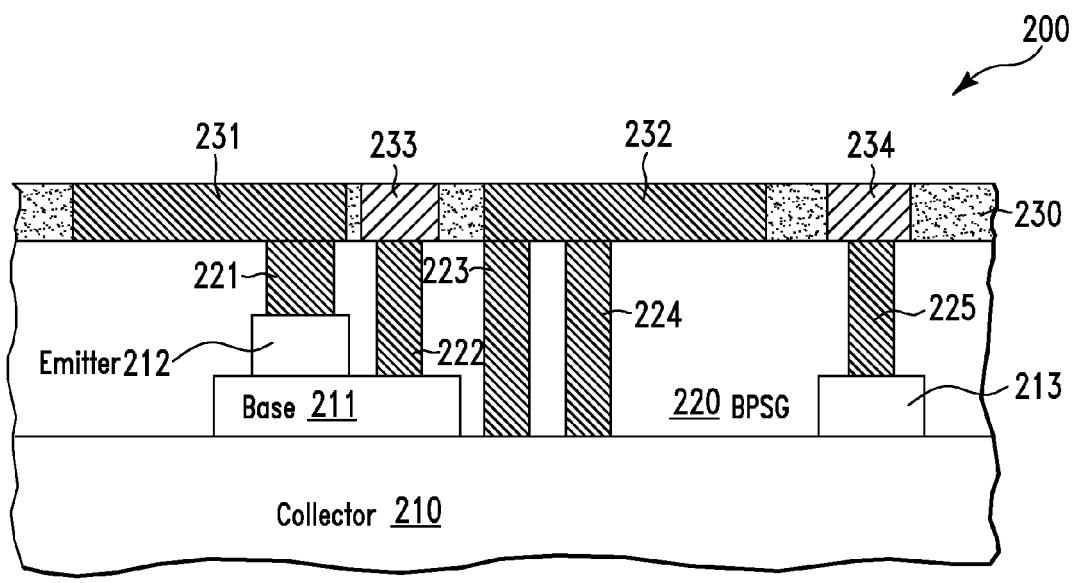

Next, with reference to FIG. 2C, in one embodiment, metal lines 233 and 234 are formed in the ILD layer 230 by using a conventional single damascene method. Illustratively, the metal line 233 is electrically coupled to the contact region 222; and the metal line 234 is electrically coupled to the contact region 225. In one embodiment, the metal lines 233 and 234 comprise copper.

Figure 2D:
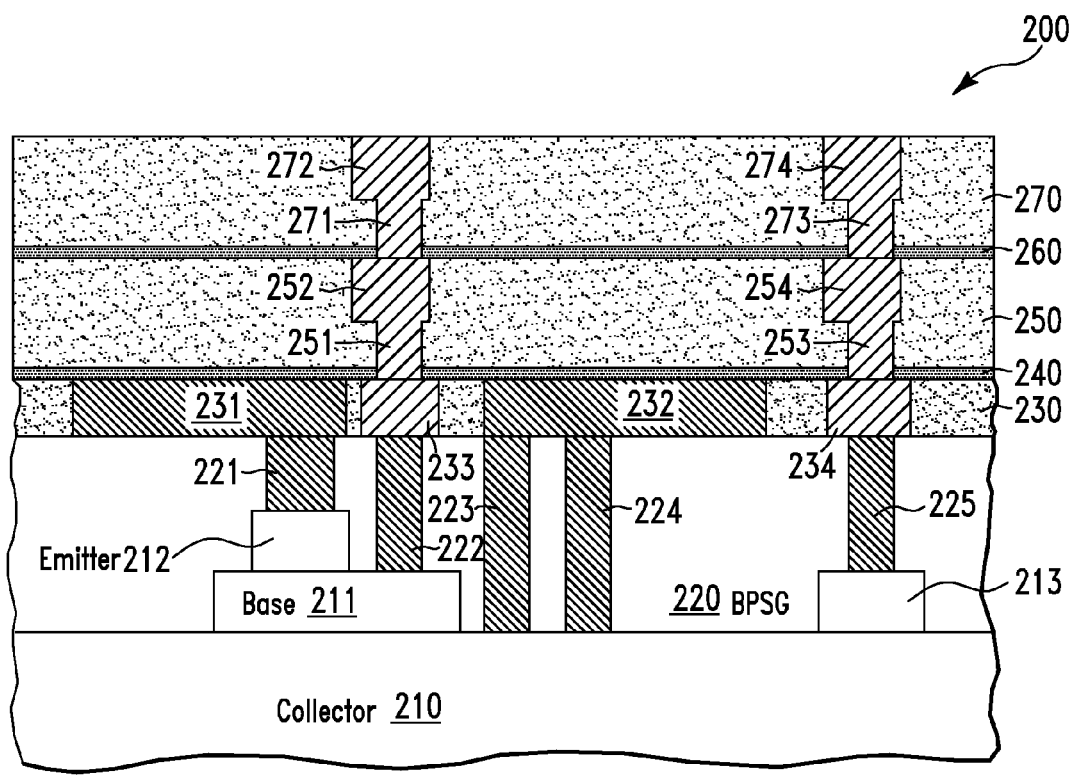

Next, with reference to FIG. 2D, in one embodiment, the formation of a barrier (e.g., silicon nitride) layer 240, an ILD layer 250, and line-via combinations 251+252 (including a metal via 251 and a metal line 252) and 253+254 (including a metal via 253 and a metal line 254) are similar to the formation of the barrier layer 160, the ILD layer 170, and the line-via combinations 171+172 (including the metal via 171 and the metal line 172) and 173+174 (including the metal via 173 and the metal line 174) of FIG. 1I, respectively. Then, in one embodiment, the formation of a barrier layer 260, an ILD layer 270, and line-via combinations 271+272 (including a metal via 271 and a metal line 272) and 273+274 (including a metal via 273 and a metal line 274) are similar to the formation of the barrier layer 160, the ILD layer 170, and the line-via combinations 171+172 (including the metal via 171 and the metal line 172) and 173+174 (including the metal via 173 and the metal line 174) of FIG. 1I, respectively.

As can be seen in FIG. 2D, the lateral current carrying lines 231 and 232 comprise tungsten which is less vulnerable to electromigration effect than copper. As a result, these two lateral current carrying lines 231 and 232 can conduct high lateral currents to and from the semiconductor emitter region 212 and the semiconductor collector region 210 of the bipolar transistor 210+211+212 without suffering from electromigration effect. This is particularly useful in the application in which the bipolar transistor 210+211+212 is used as a power transistor in a semiconductor chip.

Figure 3A:
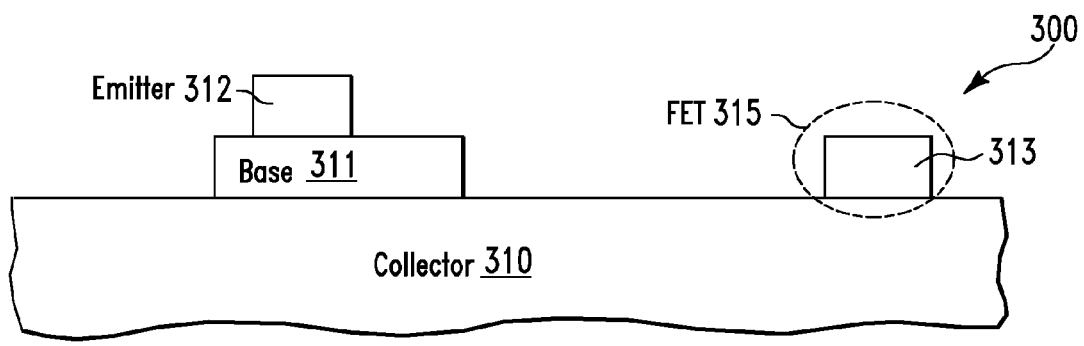
FIGS. 3A-3D illustrate a design structure including a circuit for a third fabrication method for forming a third semiconductor structure, in accordance with embodiments of the present invention.

FIGS. 3A-3D illustrate a design structure including a circuit for a third fabrication method for forming a third semiconductor structure 300, in accordance with embodiments of the present invention. More specifically, in one embodiment, the third fabrication method starts out with the structure 300 of FIG. 3A. In one embodiment, the structure 300 of FIG. 3A is similar to the structure 100 of FIG. 1A. Illustratively, the formation of the structure 300 of FIG. 3A is similar to the formation of the structure 100 of FIG. 1A. It should be noted that similar regions of the structure 300 of FIG. 3A and the structure 100 of FIG. 1A have the same reference numerals, except for the first digit. For instance, a semiconductor base region 311 (FIG. 3A) and the semiconductor base region 111 (FIG. 1A) are similar.

Figure 3B:
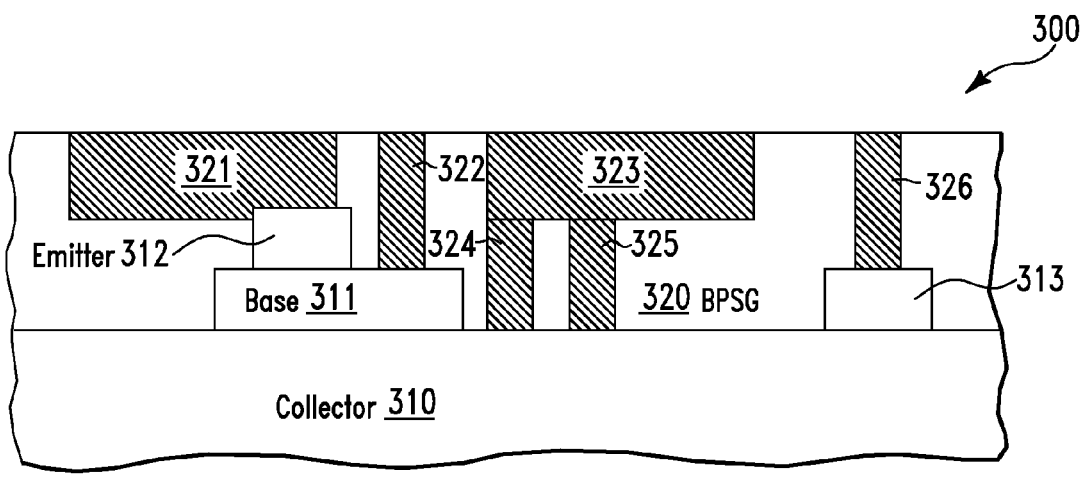

Next, with reference to FIG. 3B, in one embodiment, a BPSG layer 320 is formed on top of the entire structure 300 of FIG. 3A. In one embodiment, the BPSG layer 320 can be formed by CVD of BPSG material on top of the entire structure 300 of FIG. 3A, followed by a CMP (Chemical Mechanical Polishing) step. Then, in one embodiment, lateral current carrying lines 321 and 323 and contact regions 322, 324, 325 and 326 are formed in the BPSG layer 320 by using a conventional method. Illustratively, the lateral current carrying line 321 is electrically coupled to the semiconductor emitter region 312; the contact region 322 is electrically coupled to the semiconductor base region 311; the contact regions 324 and 325 and the lateral current carrying line 323 are electrically coupled to the semiconductor collector region 310; and the contact region 326 is electrically coupled to the gate electrode region 313. In one embodiment, the lateral current carrying lines 321 and 323 and the contact regions 322, 324, 325 and 326 comprise tungsten.

Figure 3C:
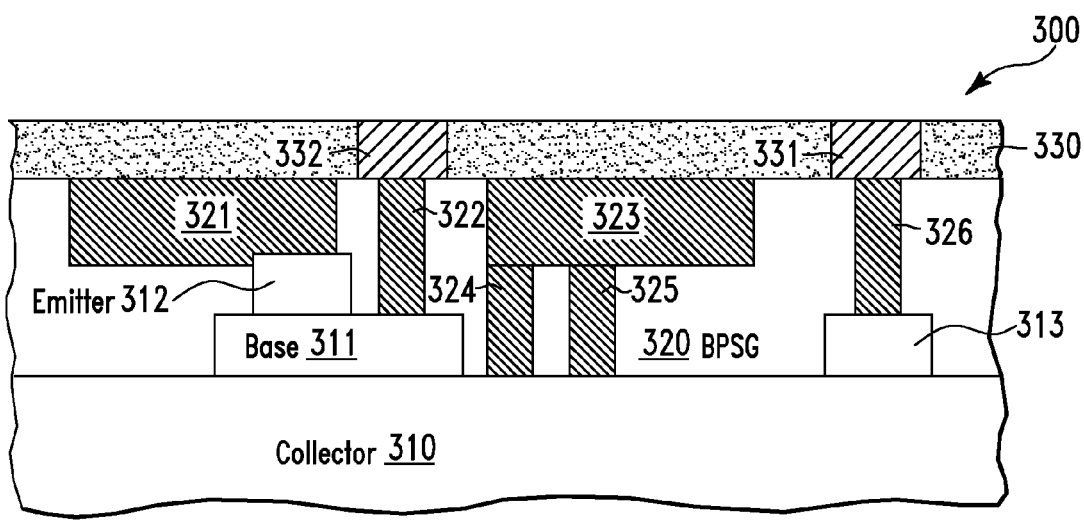

Next, with reference to FIG. 3C, in one embodiment, an ILD layer 330 and metal lines 331 and 332 are formed. More specifically, the formation of the ILD layer 330 and the metal lines 331 and 332 are similar to the formation of the ILD layer 130 and the metal line 132 of FIG. 1C, respectively.

Figure 3D:
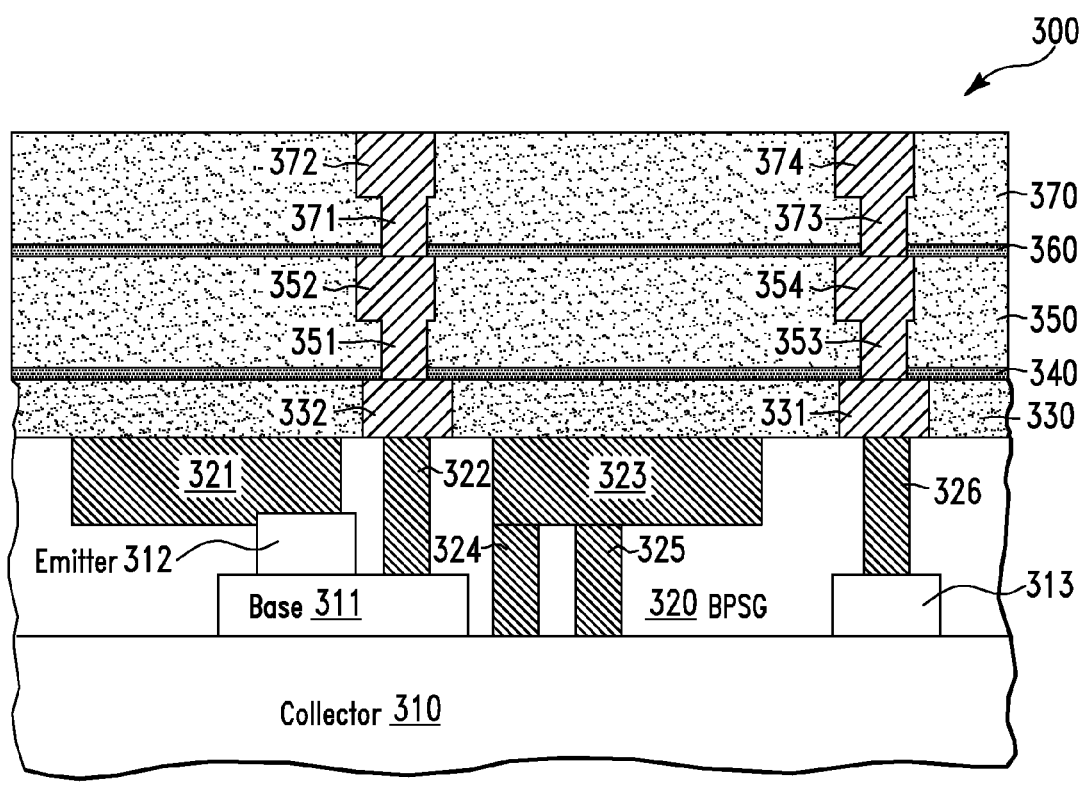

Next, with reference to FIG. 3D, in one embodiment, the formation of the structure 300 of FIG. 3D is similar to the formation of the structure 200 of FIG. 2D from FIG. 2C.

As can be seen in FIG. 3D, the lateral current carrying lines 321 and 323 comprise tungsten which is less vulnerable to electromigration effect than copper. As a result, these two lateral current carrying lines 321 and 323 can conduct high lateral currents to and from the semiconductor emitter region 312 and the semiconductor collector region 310 of the bipolar transistor 310+311+312 without suffering from electromigration effect. This is particularly useful in the application in which the bipolar transistor 310+311+312 is used as a power transistor in a semiconductor chip.

Figure 4A:
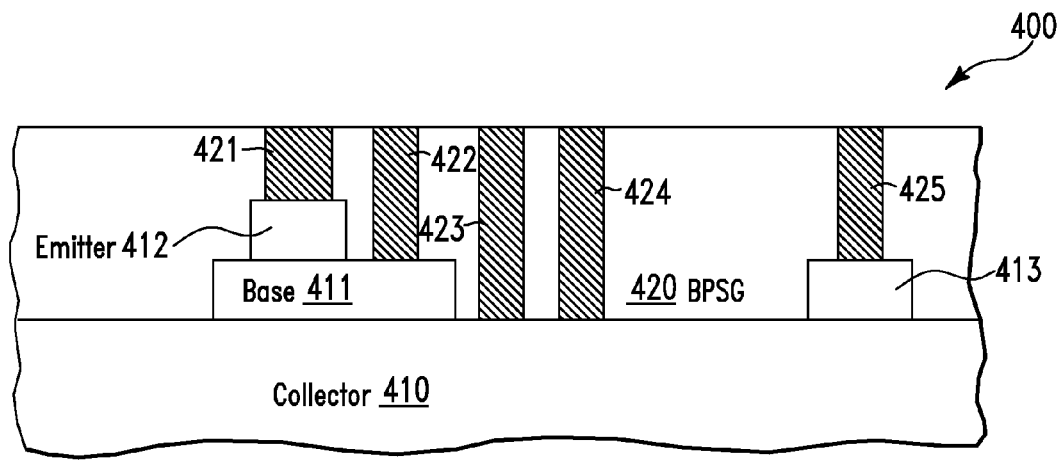
FIGS. 4A-4D illustrate a design structure including a circuit for a fourth fabrication method for forming a fourth semiconductor structure, in accordance with embodiments of the present invention.

FIGS. 4A-4D illustrate a design structure including a circuit for a fourth fabrication method for forming a fourth semiconductor structure 400, in accordance with embodiments of the present invention. More specifically, in one embodiment, the fourth fabrication method starts out with the structure 400 of FIG. 4A. In one embodiment, the structure 400 of FIG. 4A is similar to the structure 100 of FIG. 1B. Illustratively, the formation of the structure 400 of FIG. 4A is similar to the formation of the structure 100 of FIG. 1B. It should be noted that similar regions of the structure 400 of FIG. 4A and the structure 100 of FIG. 1B have the same reference numerals, except for the first digit. For instance, a semiconductor base region 411 (FIG. 4A) and the semiconductor base region 111 (FIG. 1B) are similar.

Figure 4B:
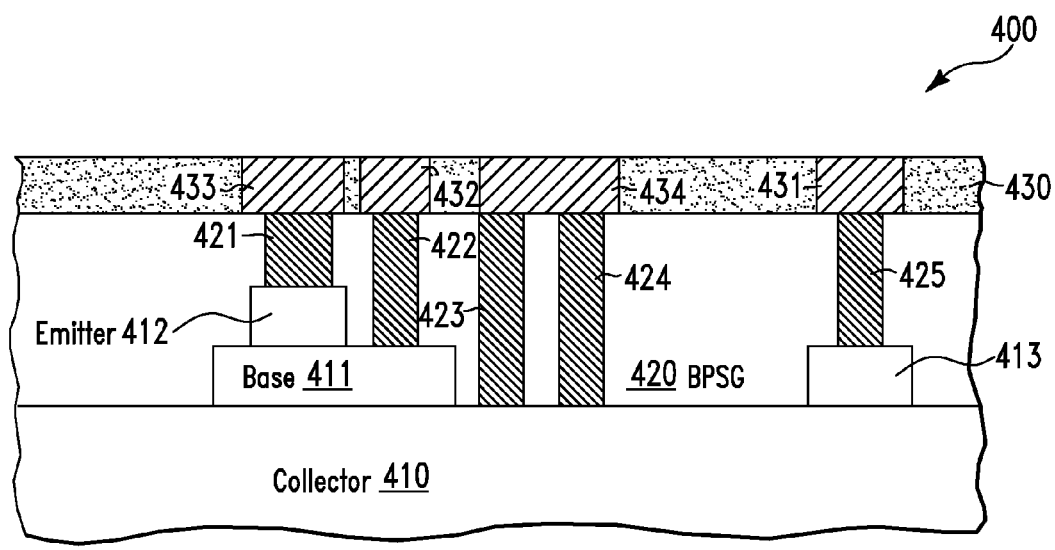

Next, with reference to FIG. 4B, in one embodiment, an ILD layer 430 is formed on top of the structure 400 of FIG. 4A, illustratively, by CVD of a dielectric material. Then, in one embodiment, metal lines 431, 432, 433 and 434 are formed in the ILD layer 430 by using a conventional single damascene method. Illustratively, the metal line 433 is electrically coupled to the contact region 421; the metal line 432 is electrically coupled to the contact region 422; the metal line 434 is electrically coupled to the contact regions 323 and 324; and the metal line 431 is electrically coupled to the contact region 425. In one embodiment, the metal lines 431, 432, 433 and 434 comprise copper.

Figure 4C:
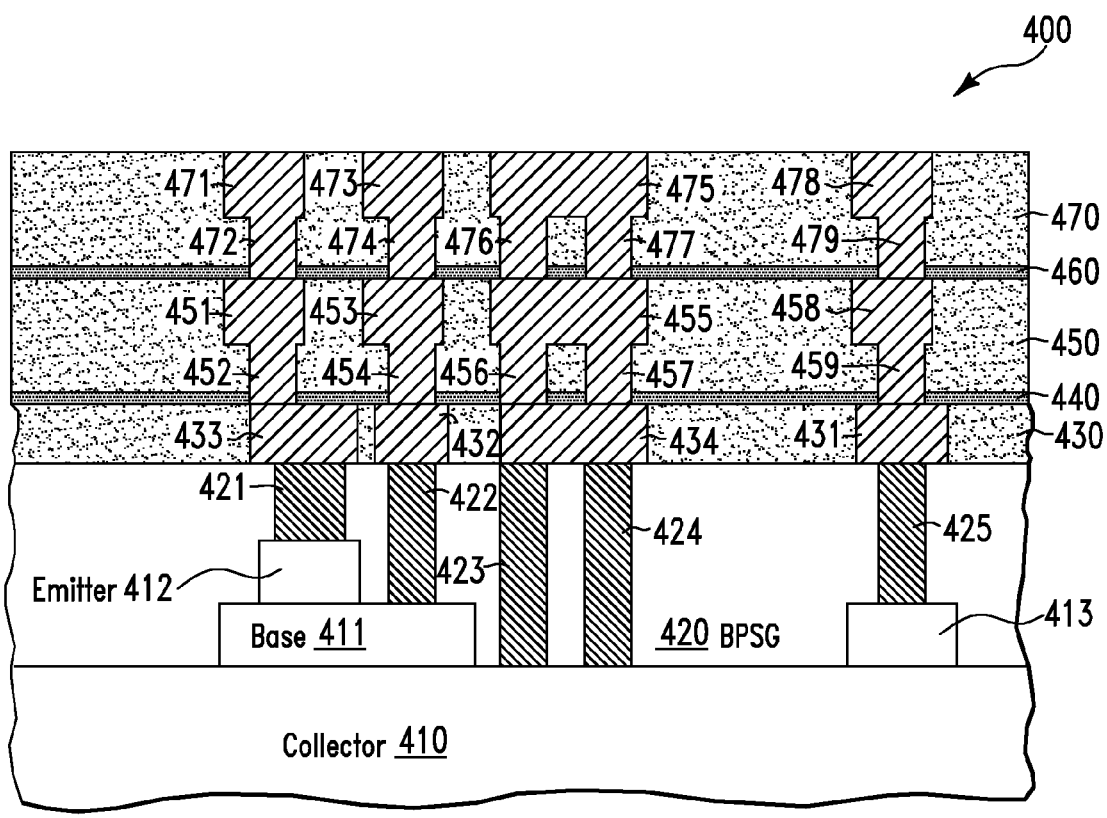

Next, with reference to FIG. 4C, in one embodiment, a barrier (e.g., silicon nitride) layer 440 is formed on top of the structure 400 of FIG. 4B, illustratively, by CVD of silicon nitride. Then, an ILD layer 450 is formed on top of the barrier layer 440, illustratively, by CVD of a dielectric material. Next, in one embodiment, line-via combinations 451+452, 453+454, 455+456+457, and 458+459 (similar to the line-via combination 171+172 of FIG. 1C) are formed in the barrier layer 440 and the ILD layer 450 by using a conventional dual damascene method. Illustratively, the line-via combination 451+452 is electrically coupled to the metal line 433; the line-via combination 453+454 is electrically coupled to the metal line 432; the line-via combination 455+456+457 is electrically coupled to the metal line 434; and the line-via combination 458+459 is electrically coupled to the metal line 431. In one embodiment, the line-via combinations 451+452, 453+454, 455+456+457, and 458+459 comprise copper. In one embodiment, there are thin metal (e.g., tantalum nitride) liner layers on side walls and bottom walls of the line-via combinations 451+452, 453+454, 455+456+457, and 458+459, but these layers are not shown for simplicity. Next, in one embodiment, in a similar manner, a barrier layer 460, an ILD layer 470, and line-via combinations 471+472, 473+474, 475+476+477, and 478+479 are formed.

Figure 4D:
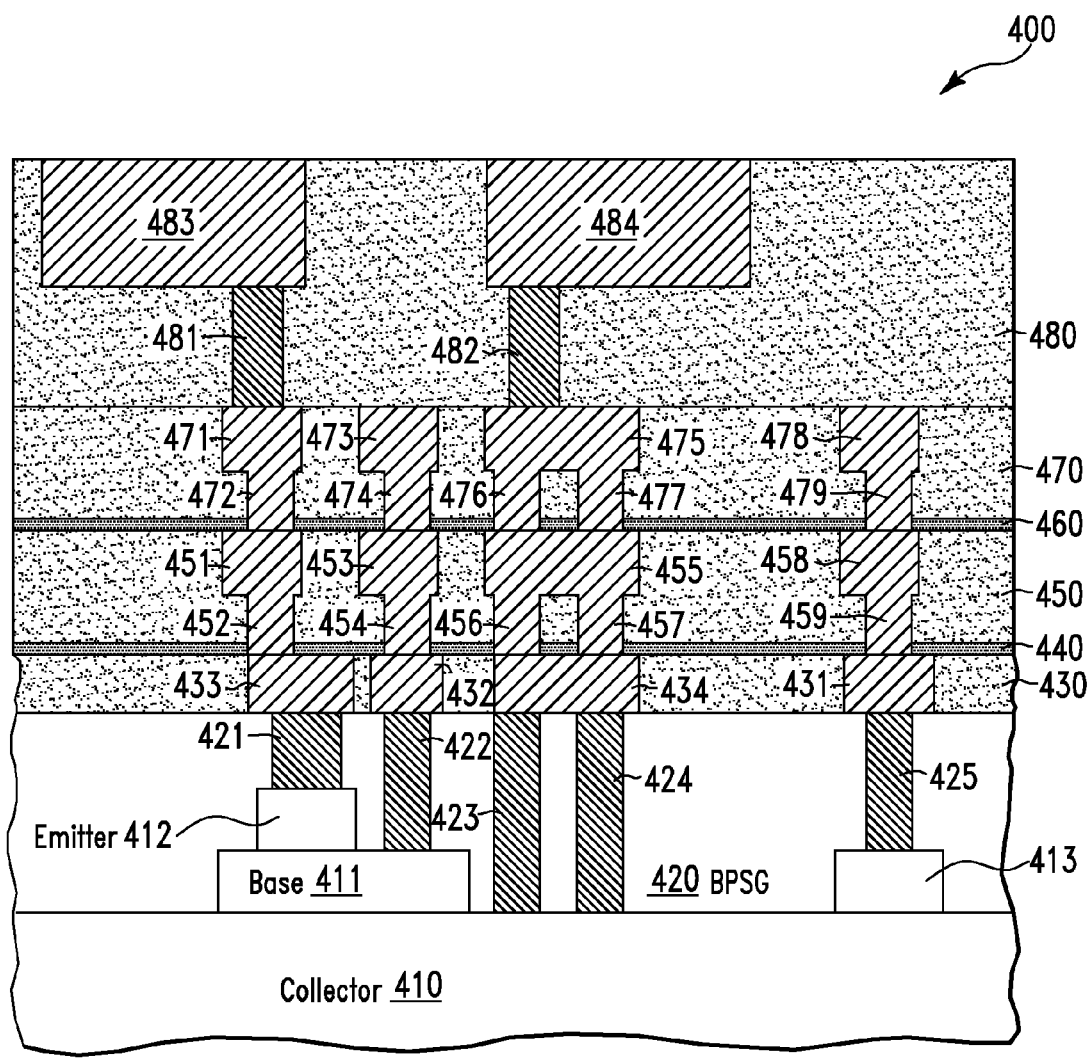

Next, with reference to FIG. 4D, in one embodiment, an ILD layer 480 is formed on top of the ILD layer 470, illustratively, by CVD of a dielectric material. Next, in one embodiment, contact regions 481 and 482 and lateral current carrying lines 483 and 484 (as shown in FIG. 4D) are formed in the ILD layer 480 by using any conventional methods. In one embodiment, the contact regions 481 and 482 comprise tungsten. In one embodiment, the contact region 481 is used to electrically couple the line-via combinations 471+472 to the lateral current carrying line 483; and the contact region 482 is used to electrically couple the line-via combination 475+476+477 to the lateral current carrying line 484. It should be noted that the metal vias 472 and 452 and the metal lines 471, 451, and 433 overlap one another. In other words, there exists an imaginary straight line that intersects all the metal vias 472 and 452 and the metal lines 471, 451, and 433. Therefore, this takes advantage of the short length effect. As a result, there is no electromigration in the electrical path to/from the bipolar transistor 410+411+412 from/to the lateral current carrying line 483.

As can be seen in FIG. 4D, the lateral current carrying lines 483 and 484 have large cross-section areas. As a result, these two lateral current carrying lines 483 and 484 can conduct high lateral currents to and from the semiconductor emitter region 412 and the semiconductor collector region 410 of the bipolar transistor 410+411+412 without suffering from electromigration effect. This is particularly useful in the application in which the bipolar transistor 410+411+412 is used as a power transistor in a semiconductor chip.

Figure 5:
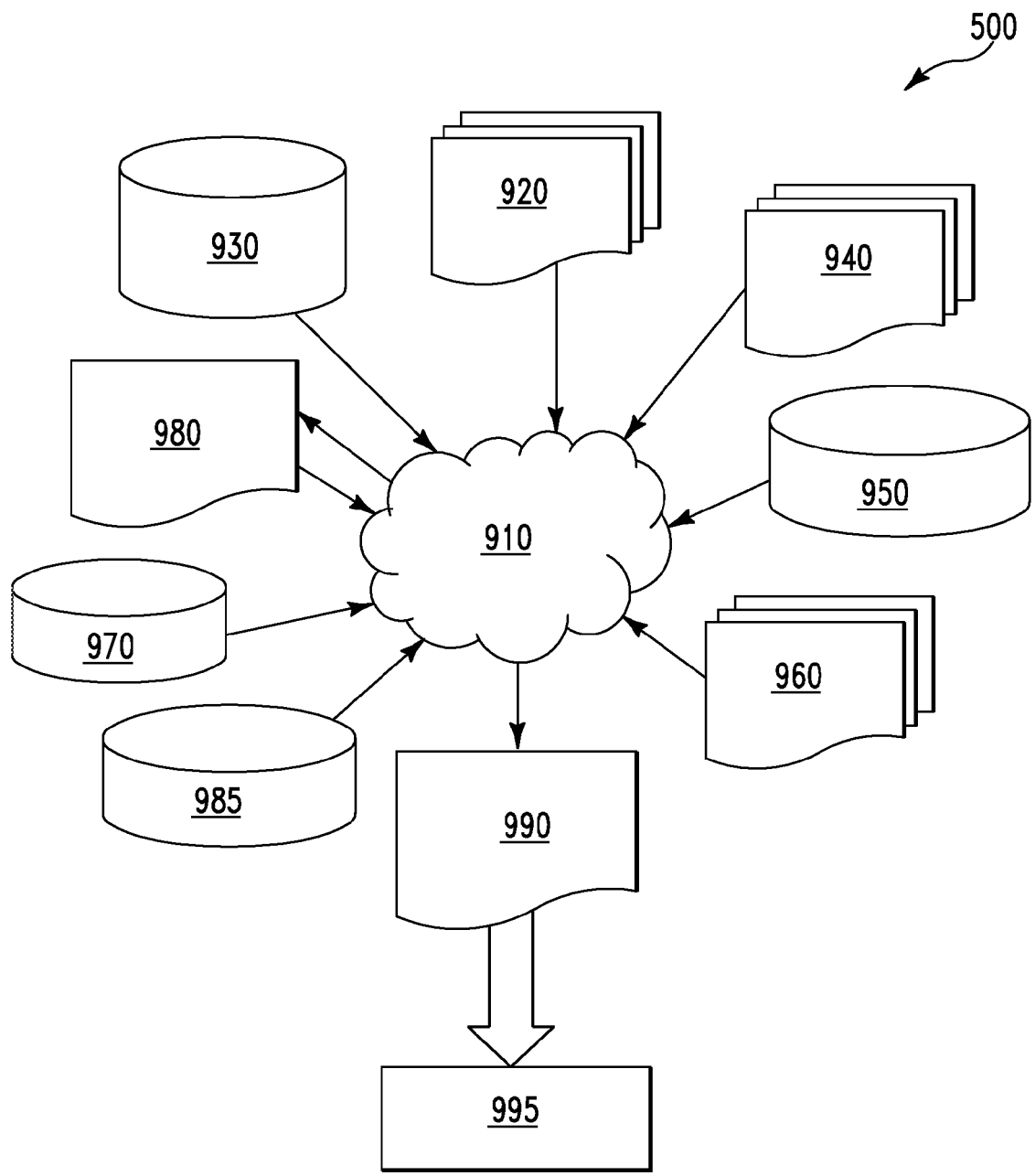
FIG. 5 shows a diagram of an exemplary design flow process in which the design structure of the present invention is processed into a form useful for developing and manufacturing semiconductor devices having lateral current carrying capability improvement.

FIG. 5 shows a block diagram of an example design flow 500. The design flow 500 may vary depending on the type of IC being designed. For example, a design flow 500 for building an application specific IC (ASIC) may differ from a design flow 500 for designing a standard component. Design structure 920 is preferably an input to a design process 910 and may come from an IP provider, a core developer, or other design company or may be generated by the operator of the design flow, or from other sources. The design structure 920 comprises the structure 100 (FIG. 1I), or the structure 200 (FIG. 2D), or the structure 300 (FIG. 3D), or the structure 400 (FIG. 4D), in the form of schematics or HDL, a hardware-description language (e.g., Verilog, VHDL, C, etc.). The design structure 920 may be contained on one or more machine readable medium. For example, the design structure 920 may be a text file or a graphical representation of the structure 100 (FIG. 1I). The design process 910 preferably synthesizes (or translates) the structure 100 (FIG. 1I) into a netlist 980, where the netlist 980 is, for example, a list of wires, transistors, logic gates, control circuits, I/O, models, etc. that describes the connections to other elements and circuits in an integrated circuit design and recorded on at least one of machine readable medium. This may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). The design process 910 may further include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the invention. The design structure of the invention is not limited to any specific design flow.

Ultimately, the design process 910 preferably translates the structure 100 (FIG. 1I), along with the rest of the integrated circuit design (if applicable), into a final design structure 990 (e.g., information stored in a GDS storage medium). The final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce the structure 100 (FIG. 1I). The final design structure 990 may then proceed to a stage 995 where, for example, the final design structure 990 proceeds to tape-out, is released to manufacturing, is sent to another design house, or is sent back to the customer.

While particular embodiments of the present invention have been described herein for purposes of illustration, many modifications and changes will become apparent to those skilled in the alt. Accordingly, the appended claims are intended to encompass all such modifications and changes as fall within the true spirit and scope of this invention.

The invention claimed is:

1. A design structure used in a design process, the design structure comprising:
    a text file or a graphical representation of a semiconductor structure,
        wherein the text file or a graphical representation is embedded in a machine readable storage medium,
        wherein the semiconductor structure includes a substrate; a first semiconductor device on the substrate; N ILD (Inter-Level Dielectric) layers on the first semiconductor device such that N is an integer greater than one; and a first electrically conductive line electrically coupled to the first semiconductor device,
        wherein the first electrically conductive line is adapted to carry a lateral electric current in a lateral direction parallel to an interfacing surface between two consecutive ILD layers of the N ILD layers,
        wherein at least one ILD layer of the N ILD layers comprises two ILD sub-layers;

wherein the first electrically conductive line is present in said two consecutive ILD layers of the N ILD layers, and wherein the first electrically conductive line does not comprise an electrically conductive via that is adapted to carry a vertical electric current in a vertical direction perpendicular to the interfacing surface.

2. The design structure of claim 1, wherein the design structure comprises a netlist, which describes the semiconductor structure.

3. The design structure of claim 1, wherein the design structure includes at least one of test data files, characterization data, verification data, or design specifications.

4. The design structure of claim 1, wherein the semiconductor structure further comprises a second semiconductor device on the substrate and a second electrically conductive line, wherein the second electrically conductive line is electrically coupled to the second semiconductor device, wherein the second electrically conductive line is present in only one ILD layer of the N ILD layers, and wherein the first electrically conductive line and the second electrically conductive line comprise a same material.

5. The design structure of claim 1, wherein the first electrically conductive line is present in both a first ILD layer and a second ILD layer of the N ILD layers.

6. The design structure of claim 5, wherein the semiconductor structure further comprises:

a second semiconductor device on the substrate; and a second electrically conductive line and a third electrically conductive line both being electrically coupled to the second semiconductor device, wherein the second electrically conductive line is configured to carry a second lateral electric current in a second lateral direction parallel to the interfacing surface, and wherein the third electrically conductive line is configured to carry a third lateral electric current in a third lateral direction parallel to the interfacing surface.

7. The design structure of claim 6, wherein the semiconductor structure further comprises:

an electrically connecting via being disposed between and electrically coupling together the second and third electrically conductive lines, wherein the electrically connecting via is configured to carry a vertical electric current in a vertical direction perpendicular to the interfacing surface, wherein the second electrically conductive line is present in the first ILD layer, and wherein both the third electrically conductive line and the electrically connecting via are present in the second ILD layer.

* * * * *